United States Patent
Akimoto

(10) Patent No.: US 7,959,831 B2
(45) Date of Patent: *Jun. 14, 2011

(54) PASTE FOR BACK CONTACT-TYPE SOLAR CELL

(75) Inventor: Hideki Akimoto, Kanagawa (JP)

(73) Assignee: E. I. du Pont de Nemours and Company, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 12/724,511

(22) Filed: Mar. 16, 2010

(65) Prior Publication Data

US 2010/0170562 A1 Jul. 8, 2010

Related U.S. Application Data

(62) Division of application No. 11/726,773, filed on Mar. 22, 2007, now abandoned.

(51) Int. Cl.
*H01B 1/22* (2006.01)
*B05D 5/12* (2006.01)
*H01L 31/0224* (2006.01)

(52) U.S. Cl. .......................... 252/514; 427/125; 136/256

(58) Field of Classification Search .................. 252/514; 136/252, 256; 427/74, 125
See application file for complete search history.

(56) References Cited

U.S. PATENT DOCUMENTS

| 4,001,146 | A | | 1/1977 | Horowitz |
| 4,153,907 | A | * | 5/1979 | Kofron .......................... 257/461 |
| 4,318,830 | A | | 3/1982 | Horowitz |
| 4,486,232 | A | * | 12/1984 | Nakatani et al. ................. 75/252 |
| 5,096,619 | A | | 3/1992 | Slack |
| 5,428,249 | A | * | 6/1995 | Sawayama et al. ........... 257/746 |
| 5,464,564 | A | | 11/1995 | Brown |
| 6,136,230 | A | | 10/2000 | Sanada |
| 7,494,607 | B2 | * | 2/2009 | Wang et al. .................... 252/514 |
| 2006/0231803 | A1 | * | 10/2006 | Wang et al. .................... 252/500 |

FOREIGN PATENT DOCUMENTS

JP 2006-295197 10/2006

* cited by examiner

*Primary Examiner* — Mark Kopec

(57) ABSTRACT

Disclosed is a paste for a back contact-type solar cell that includes: (a) electrically conductive particles containing silver particle and added particles selected from the group consisting of (i) metal particles selected from the group consisting of Mo, Tc, Ru, Rh, Pd, W, Re, Os, Ir and Pt particles, (ii) a metal alloy containing the metal particles, and (iii) particles loaded with the metal particles, (b) glass frit, and (c) a resin binder.

6 Claims, 6 Drawing Sheets

Wafer: 20mm sq.
Electrode: 6mm diameter
Distance: 1mm $R_{(measure)} = 2 \times R_{(contact)} + R_{(Si Wafer)}$ $R_{(Si Wafer)}$ = Constant

PASTE FOR BACK CONTACT-TYPE SOLAR CELL

This application is a divisional application of Ser. No. 11/726,773, now abandoned, filed on Mar. 22, 2007.

BACKGROUND OF THE INVENTION

1. Field of the Invention

The present invention relates to a paste for a solar cell, and more particularly, to an electrically conductive paste used to form electrodes of a back contact-type solar cell.

2. Technical Background

Silver paste is widely used for the electrode paste used in solar cells, since electrode pastes for solar cells are required to have low electrical resistance to facilitate improved efficiency. In the case of contact between a metal and semiconductor, a Schottky barrier is known to be formed that causes a considerable increase in contact resistance. This type of contact is referred to as Schottky contact. Since the electrical resistance of an electrode is the sum of the conductor resistance and contact resistance, in addition to lowering the conductor resistance of an electrode paste, it is also necessary to reduce the contact resistance with the conductor. The ideal contact of an electrode material, free of a Schottky barrier, is referred to as Ohmic contact; and contact resistance is known to decrease in this contact state.

Methods for realizing Ohmic contact at the interface between a metal and semiconductor consist of either reducing the Schottky barrier height from the semiconductor to zero, or reducing the thickness of the electrode material to narrow the width of the Schottky barrier and approach the behavior of Ohmic resistance due to a tunnel effect.

Examples of such methods include a technique in which the thickness of a layer formed between a metal and semiconductor for electrical continuity is decreased, a technique in which multilayer thin films which have similar work function are inserted between the metal and semiconductor, a technique in which a film interposed between the metal and semiconductor is subjected to high-temperature heat treatment to form an alloy, and a technique in which contact resistance is decreased by high-temperature annealing. In the case of solar cells, however, high-temperature treatment results in the risk of lowering the power generation efficiency of the cell. In addition, in the case of the application of thin films technique, the production process is time-consuming and complex, thereby preventing production from being carried out at low cost.

Recently however, studies have been conducted on back contact-type solar cells for the purpose of further enhancing the power generation efficiency of solar cells. Back contact-type solar cells refer to solar cells in which the electrodes are formed on the opposite side from the sunlight receiving side (back side), thereby making it possible to increase the light receiving surface since the electrodes are not formed on the light receiving surface. The structure of conventional crystalline solar cells in which the electrodes are formed on the light receiving surface typically consisted of the formation of an n layer on the light receiving side of a p-type semiconductor. Consequently, electrically conductive paste for electrodes used on the light receiving side was also developed for use with an n-type semiconductor. An aluminum paste is used to utilize BSF effects on the back side. Since aluminum has an inferior adhesive strength as compared with solder, silver paste is used at those portions requiring soldering. This silver paste for the back side is used primarily for the purpose of ensuring electrical connection with the aluminum paste and physical connection with the substrate, and Ohmic resistance with the p-type semiconductor is not required.

However, in the case of back contact-type solar cells, it is necessary to develop electrodes having low contact resistance with the p-type semiconductor layer and to develop an electrically conductive paste for back contact applications.

Moreover, the method for forming electrodes employs a thin film process using vapor deposition or sputtering, and a thick film process using a paste. It is preferable to form the electrodes using a thick film process in consideration of production costs. In order to minimize the decrease in solar cell efficiency caused by thermal damage, an electrode formation method is required that allows electrodes to be formed at a low temperature and in a short period of time. Low-temperature, short-duration production is also important with respect to costs and production efficiency.

In the case of solar cells in which electrodes are formed on both sides, the light receiving side paste usually contains as basic components electrically conductive particles in the form of Ag, binder, glass frit and a solvent (see, for example, Japanese Patent Application Laid-open No. 2006-295197). In Japanese Patent Application Laid-open No. 2006-295197, examples of electrically conductive particles include metal particles selected from the group consisting of Cu, Au, Ag, Pd, Pt, alloys of Cu, Au, Ag, Pd and Pt, and mixtures thereof. On the other hand, a paste composed primarily of aluminum is typically used for the paste for forming sites on the back side that contact the semiconductor.

The present invention provides a paste able to be applied to a back contact-type solar cell having low contact resistance between formed electrodes and a semiconductor.

In addition, the present invention provided a method for forming electrodes having low contact resistance with a semiconductor on the back of a solar cell substrate using an electrically conductive paste.

SUMMARY OF THE INVENTION

The present invention is a paste for a back contact-type solar cell comprising: (a) electrically conductive particles containing silver particles and added particle selected from the group consisting of (i) metal particles selected from the group consisting of Mo, Tc, Ru, Rh, Pd, W, Re, Os, Ir and Pt particles, (ii) a metal alloy containing the metal particles, and (iii) particles loaded with the metal particles, (b) glass frit, and (c) a resin binder.

In addition, the present invention is a method for producing a solar cell electrode, comprising the steps of: (1) applying a paste comprising (a) electrically conductive particles containing silver particle and added particle selected from the group consisting of (i) metal particles selected from the group consisting of Mo, Tc, Ru, Rh, Pd, W, Re, Os, Ir and Pt particles, (ii) a metal alloy containing the metal particles, and (iii) particles loaded with the metal particles, onto the opposite side from the light receiving side of a back contact-type solar cell substrate; and (2) firing the applied paste.

In addition, the present invention is a solar cell electrode formed on the opposite side from the sunlight receiving side, comprising as a conductive component: silver particles; and added particles selected from the group consisting of (i) metal particles selected from the group consisting of Mo, Tc, Ru, Rh, Pd, W, Re, Os, Ir and Pt particles, (ii) a metal alloy containing the metal particles, and (iii) particles loaded with the metal particles.

Electrodes formed using the paste of the present invention have low contact resistance with the solar cell semiconductor.

In addition, the paste of the present invention is able to form p-type electrodes having superior electrical characteristics by applying onto a p-type semiconductor and firing. Moreover, the electrodes can be formed by a thick film process, thereby enabling the electrodes to be formed economically. The use of low-temperature firing makes it possible to further enhance efficiency and economy.

A solar cell provided with electrodes formed using the paste of the present invention has low contact resistance between the electrodes and semiconductor, and has superior power generation characteristics.

BRIEF DESCRIPTION OF THE DRAWINGS

FIGS. 6A and 6B are drawings showing the shape of a sample for measuring the contact resistance of electrodes produced on an Si substrate using the electrically conductive paste of the present invention, while

DETAILED DESCRIPTION OF THE INVENTION

Figure 1A:
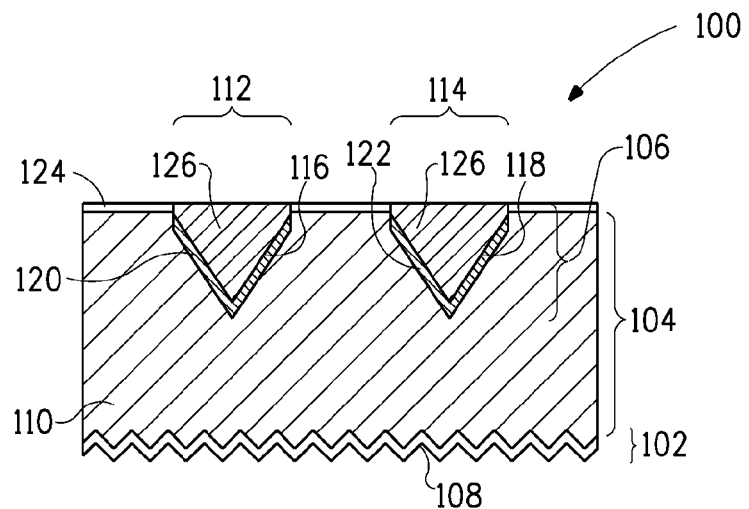
FIG. 1A is a cross-sectional schematic drawing of a portion of a solar cell as claimed in the present invention.

A first embodiment of the present invention relates to a paste for a back contact-type solar cell. The paste for a back contact-type solar cell of the present invention comprises: (a) electrically conductive particles containing silver particles and added particle selected from the group consisting of (i) metal particles selected from the group consisting of Mo, Tc, Ru, Rh, Pd, W, Re, Os, Ir and Pt particles, (ii) a metal alloy containing the metal particles, and (iii) particles loaded with the metal particles, (b) glass frit, and (c) a resin binder.

In the art, because of high contact resistance with p-type silicon, Ag paste is not used as an electrode for a back contact-type solar cell. Addition of other components and, particularly the addition of precious metals such as Pd or Pt is avoided for conventional crystalline solar cell. Price increase of the paste, and lowering electrical conductivity was expected by adding precious metals. A preferable paste is obtained for use in a back contact-type solar cell by lowering the contact resistance through the addition of a predetermined metal to the paste.

In the present invention, no application of an aluminum paste as the back contact-type solar cell is required. Additionally, the paste(s) of the present invention provides low contact resistance.

The following provides an explanation of each component of the paste of the present invention.

1. Silver Particle

Silver (Ag) particles are used as an electrically conductive metal. The silver particle may be in the shape of flakes, spheres or they may be amorphous. Although there are no particular limitations on the particle diameter of the silver particle from the viewpoint of technical effects in the case of being used as an ordinary electrically conductive paste, particle diameter has an effect on the sintering characteristics of the silver (for example, silver particle having a large particle diameter are sintered at a slower rate than silver particle having a small particle diameter). Thus, although the particle diameter ($d_{50}$) is preferably within the range of 0.1 to 10.0 μm, the particle diameter of the silver particle actually used is determined according to the firing profile. Moreover, it is necessary that the silver particle having a particle diameter suited for methods for applying an electrically conductive paste (for example, screen printing). In the present invention, two or more types of silver particle having different particle diameters may be used as a mixture.

Normally, the silver preferably has a high purity (greater than 99%). However, substances of lower purity can be used depending on the electrical requirements of the electrode pattern.

Although there are no particular limitations on the silver content provided it is an amount that allows the object of the present invention to be achieved, in the case of silver particle, the silver content is preferably 40 to 90% by weight based on the weight of the paste.

2. Added Particles

In the present invention, 3d or 4d transition metals belonging to groups 6 to 11 of the periodic table are used in addition to the silver particle. Namely, metal particles selected from the group consisting of Mo (molybdenum), Tc (technetium), Ru (ruthenium), Rh (rhodium), Pd (palladium), W (tungsten), Re (rhenium), Os (osmium), Ir (iridium) and Pt (platinum) are added. Ruthenium, palladium or platinum is preferable from the viewpoint of lowering contact resistance.

In the present invention, alloy particles containing the above-mentioned metals or particles loaded with the above-mentioned metal particles can also be used preferably. Examples of alloys containing the metal particles (also referred to as added particles in the present description) include Ag/Pd alloy and Ni/Mo alloy. Examples of particles loaded with the metal particles include Pt-loaded graphite and Pd-loaded graphite.

The amount of the added particles is in the range of 0.01 to 10% by weight and any ranges contained therein, and preferably 0.1 to 5% by weight based on the weight of the paste. If the amount of added particles is excessively low, effects are not obtained. In addition, if the amount of added particles is excessively high, conductor resistance increases, sinterability decreases and costs increase.

As mentioned hereinbefore, the present invention is characterized in that both the silver particle and the added particle are used. The addition of a third conductive particle, which is not included the concept of the silver particles nor the added particle, is not excluded. However, the content of the third conductive particles is preferably less than 2 wt % based on the weight of the paste.

3. Glass Frit

The electrically conductive paste of the present invention preferably contains an inorganic binder in the form of glass frit.

Since the chemical composition of the glass frit is not important in the present invention, any glass frit can be used provided it is a glass frit used in electrically conductive pastes for electronic materials. For example, lead borosilicate glass is used preferably. Lead borosilicate glass is a superior material in the present invention from the standpoint of both the range of the softening point and glass adhesion. In addition, lead-free glass, such as a bismuth silicate lead-free glass, can also be used.

Although there are no particular limitations on the content of the inorganic binder in the form of the glass frit provided it is an amount that allows the object of the present invention to be achieved, it is 0.5 to 15.0% by weight and preferably 1.0 to 10.0% by weight based on the weight of the paste. If the amount of the inorganic binder is less than 0.5% by weight, adhesive strength may become inadequate. If the amount of the inorganic binder exceeds 15.0% by weight, problems may be caused in the subsequent soldering step due to floating glass and so on. In addition, the resistance value as a conductor also increases.

4. Resin Binder

The electrically conductive paste of the present invention contains a resin binder. In the present description, the concept of a "resin binder" includes a mixture of a polymer and thinner. Thus, an organic liquid (also referred to as a thinner) may be contained in the resin binder. In the present invention, a resin binder containing an organic liquid is preferable, and in the case of high viscosity, an organic liquid can be added separately as a viscosity adjuster as necessary.

In the present invention, any resin binder can be used. In the present invention, examples of the resin binder include a pine oil solution, ethylene glycol monobutyl ether monoacetate solution or ethyl cellulose terpineol solution of a resin (such as polymethacrylate) or ethyl cellulose. In the present invention, a terpineol solution of ethyl cellulose (ethyl cellulose content: 5 to 50% by weight) is used preferably. Furthermore, in the present invention, a solvent not containing a polymer, such as water or an organic liquid, can be used as a viscosity adjuster. Examples of organic liquids that can be used include alcohols, alcohol esters (such as acetates or propionates), and terpenes (such as pine oil or terpineol).

The content of the resin binder is preferably 10 to 50% by weight based on the weight of the paste.

5. Additives

A thickener and/or stabilizer and/or other typical additives may be or may not be added to the electrically conductive paste of the present invention. Examples of other typical additives that can be added include dispersants and viscosity adjusters. The amount of additive is determined dependent upon the characteristics of the ultimately required electrically conductive paste. The amount of additive can be suitably determined by a person with ordinary skill in the art. Furthermore, a plurality of types of additives may also be added.

As is explained below, the electrically conductive paste of the present invention has a viscosity within a predetermined range. A viscosity adjuster can be added as necessary to impart a suitable viscosity to the electrically conductive paste. Although the amount of viscosity adjuster added changes dependent upon the viscosity of the ultimate electrically conductive paste, it can be suitably determined by a person with ordinary skill in the art.

The electrically conductive paste of the present invention can be produced as desired by mixing each of the above-mentioned components with a roll mixing mill or rotary mixer and the like. Although the electrically conductive paste of the present invention is preferably printed onto a desired site on the back side of a solar cell by screen printing, in the case of being printed by this type of printing, the paste preferably has a predetermined viscosity range. The viscosity of the electrically conductive paste of the present invention is preferably 50 to 350 PaS in the case of using a #14 spindle with a Brookfield HBT viscometer and measuring using a utility cup at 10 rpm and 25° C.

As has been described above, the paste having electrical conductivity of the present invention is used to form electrodes on the opposite side from the light receiving side of a solar cell. Namely, the paste of the present invention printed and dried on the opposite side from the light receiving side of a solar cell.

Sintering after drying is carried out at temperature of 450° C. to 900° C. and preferably 450° C. to 700° C. Conventionally, the mixture of silver particles and aluminum particle was occasionally used. The paste containing Al particle requires a sintering at a high temperature to form an alloy of Si and Al, which delivers a good contact resistance. However, in case that the paste containing Al is applied for back-contact electrode, the sintering at a high temperature may infer a problem in terms of good P-N junctions. In other words, the Al easily diffuses into the substrate and bring damage since the P-N junction is very thin at the back side of solar cell. Sintering at a low temperature offers the advantages of reducing damage to P-N junctions, decreasing susceptibility to the occurrence of destruction caused by thermal damage and lowering costs. In this context, the content of Al is preferably less than 2 wt %, more preferably less than 1 wt % based on the weight of the paste so that lower sintering temperature can be adapted.

The following provides an explanation of a back contact-type solar cell using the electrically conductive paste of the present invention and an explanation of a production process of back contact-type solar cell electrodes of the present invention using the example of a solar cell having the structure shown in FIG. 1, while also providing an explanation of an example of the fabrication of a solar cell.

Figure 1B:
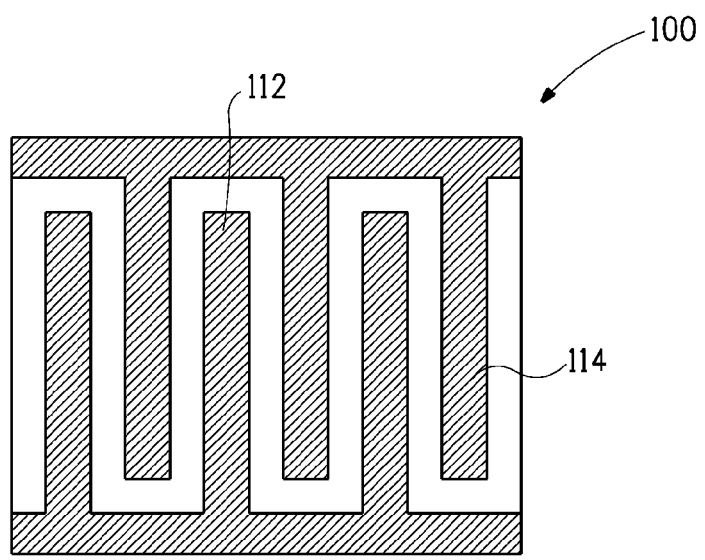
FIG. 1B is an overhead view showing an electrode pattern on a side opposite from a light receiving side in a portion of a solar cell as claimed in the present invention.

FIG. 1A is a cross-sectional drawing of a portion of a solar cell as claimed in the present invention, while FIG. 1B is an overhead view showing a portion an electrode pattern on the opposite side from the light receiving side. A solar cell 100 is composed of a light receiving section 102, a carrier generating section 104 and an electrode section 106. The light receiving section 102 has a textured structure, and the surface thereof is covered with a anti-reflective film 108. The anti-reflective film 108 is a thin film composed of, for example, titanium dioxide ($TiO_2$) and silicon dioxide ($SiO_2$). As a result of the light receiving section 102 having a textured structure covered by this anti-reflective film 108, more incident light enters the carrier generating section 104, thereby making it possible to increase the conversion efficiency of the solar cell 100.

The carrier generating section 104 is composed of a semiconductor 110. When light from the light receiving section 102 (and particularly light having energy equal to or greater than the band gap of the semiconductor 110) enters this semiconductor 110, valence band electrons are excited to the conduction band, free electrons are generated in the conduction band, and free holes are generated in the valence band. These free electrons and free holes are referred to as carriers. If these carriers reach the electrode section 106 by diffusion prior to being recombined in the carrier generating section 104, a current can be obtained from the electrode section 106. Thus, in order to increase the conversion efficiency of the solar cell 100, it is preferable to use a semiconductor that impairs carrier recombination (namely, has a long carrier life). For this reason, the semiconductor 110 used in the carrier generating section 104 is preferably, for example, crystalline silicon having high resistance.

The electrode section 106 is a section where current generated in the carrier generating section 104 is obtained. This electrode section 106 is formed on the opposite side from the side of the light receiving section 102 of the semiconductor 110. The electrode section 106 has an anode 112 and a cathode 114, and these are alternately formed on the opposite side from the side of the light receiving section 102 of the semiconductor 110. The anode and the cathode are respectively formed in the form of V grooves 116 and 118 having triangular cross-sections. A p+ semiconductor layer 120 is formed in the V groove 116 of the anode, while an n+ semiconductor layer 122 is formed in the V groove 118 of the cathode. The surface of the side opposite from the side of the light receiving section 102 is covered with an oxide film 124. In addition, electrodes 126 formed from the electrically conductive paste of the present invention are embedded in the V grooves.

Next, an explanation is provided of the production process of the back contact-type solar cell electrodes of the present invention along with an explanation of the production process of a back contact-type solar cell with reference to FIGS. 2 to 5.

The solar cell electrode production process of the present invention is comprised of the following steps of: (1) applying an electrically conductive paste containing (a) electrically conductive particles containing silver particles and added particle selected from the group consisting of (i) metal particles selected from the group consisting of Mo, Tc, Ru, Rh, Pd, W, Re, Os, Ir and Pt particles, (ii) a metal alloy containing the metal particles, and (iii) particles loaded with the metal particles, (b) glass frit, and (c) a resin binder, onto the opposite side from the light receiving side of a back contact-type solar cell substrate; and
(2) Firing the Applied Paste.

First, an explanation is provided of the production a back contact-type solar cell substrate used to produce back contact-type solar cell electrodes with reference to FIGS. 2 to 4.

Figure 2A:
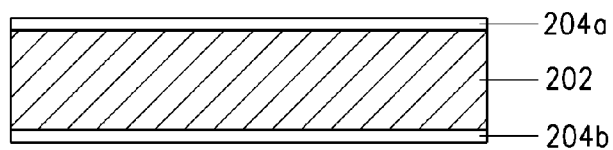
FIGS. 2A to 2E are drawings for explaining a production process when producing a solar cell.
Figure 2B:
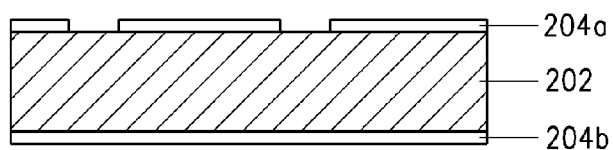

A high-resistance silicon (100) substrate 202 (having a thickness of, for example, 250 µm) is prepared, and oxide films 204a and 204b are formed on both sides thereof (FIG. 2A). These oxide films can be formed by, for example, thermal oxidation. Next, the oxide film 204a on one side of the silicon substrate is removed by photolithography or laser etching and so on to leave stripes of a predetermined width (for example, width of 100 µm and interval of 300 µm) (FIG. 2B).

Figure 2C:
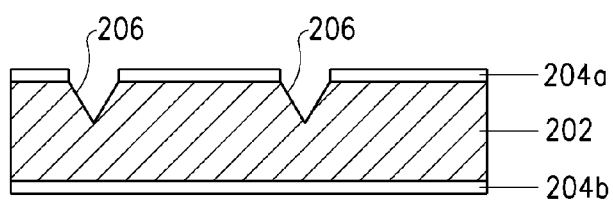

Next, anisotropic etching is carried out with potassium hydroxide (KOH) or tetramethyl ammonium hydroxide (TMAH) on the side from which a portion of the oxide film has been removed, to form V grooves 206 (at an interval of, for example, 300 µm) in the form of stripes having a triangular cross-section (FIG. 2C).

Figure 2D:
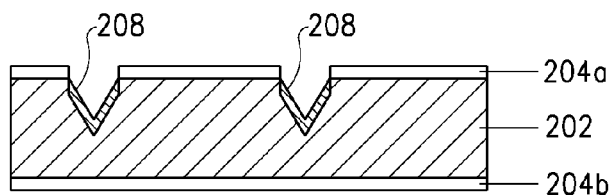
Figure 2E:
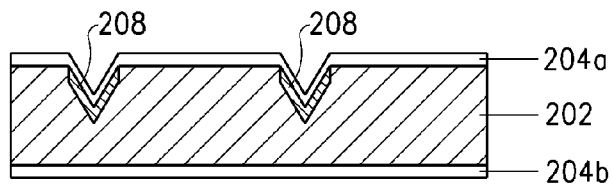

Next, the substrate in which the V grooves 206 have been formed is placed in a diffusion furnace to diffuse the phosphorous. As a result of these steps, an $n^+$-type silicon layer 208 is formed on the portions of the silicon where the V grooves 206 have been formed as shown in FIG. 2D. In the diffusion furnace, by interrupting the gas serving as the phosphorous material and introducing only oxygen, the surfaces of the V grooves 206 can be covered with an oxide film (FIG. 2E).

Figure 3A:
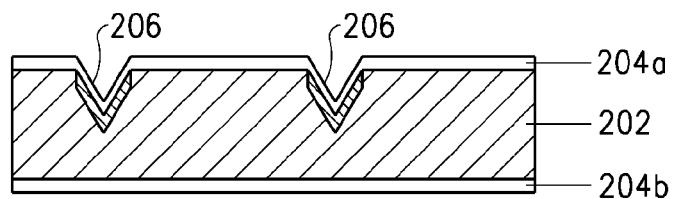
FIGS. 3A to 3E are drawings for explaining a production process when producing a solar cell.
Figure 3B:
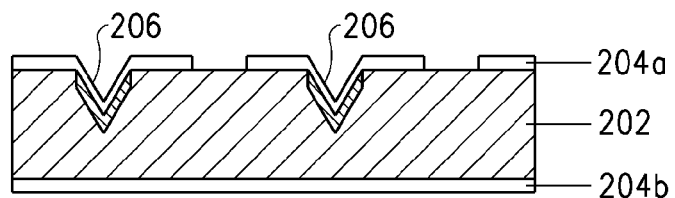

The oxide film is then removed from the substrate obtained in this manner (FIG. 3A) at equal intervals by photolithography or laser etching at the portions between the V grooves 206 of the oxide film 204a (FIG. 3B). For example, in the case the oxide film portion between the V grooves 206 has a width of 300 the oxide film is removed so that the distance from the V grooves 206 on both sides of this oxide film portion is 100 µm.

Figure 3C:
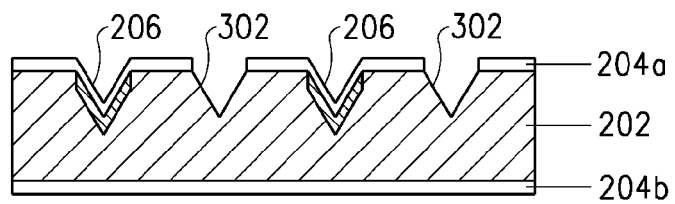

Next, anisotropic etching is carried out with potassium hydroxide (KOH) or tetramethyl ammonium hydroxide (TMAH) and so on at those locations where the oxide film has been removed to form V grooves 302 (at a width of, for example, 100 µm) in the form of stripes having a triangular cross-section (FIG. 3C).

Figure 3D:
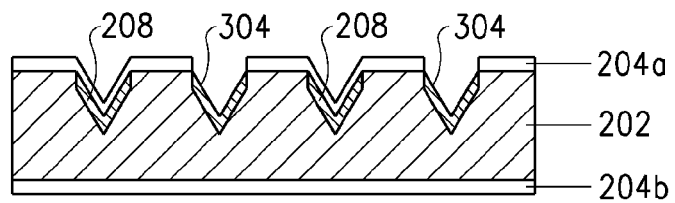
Figure 3E:
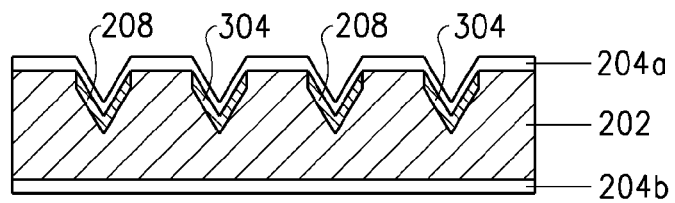

Next, the substrate in which the V grooves 302 have been formed is placed in a diffusion furnace to diffuse the boron. As a result, as shown in FIG. 3D, a $p^+$-type silicon layer 304 is formed on the silicon portions of the V grooves 302. In the diffusion furnace, by interrupting the gas serving as the boron material and introducing oxygen only, the surfaces of the V grooves 302 can be covered with an oxide film (FIG. 3E).

Figure 4A:
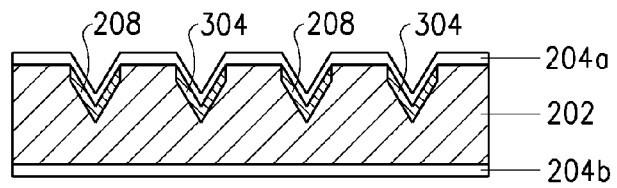
FIGS. 4A to 4D are drawings for explaining a production process when producing a solar cell.
Figure 4B:
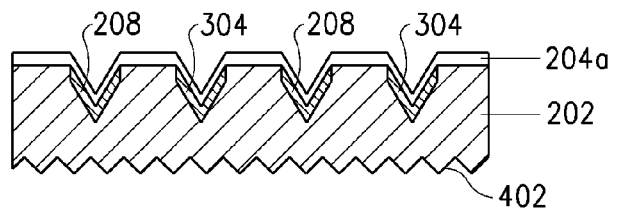
Figure 4C:
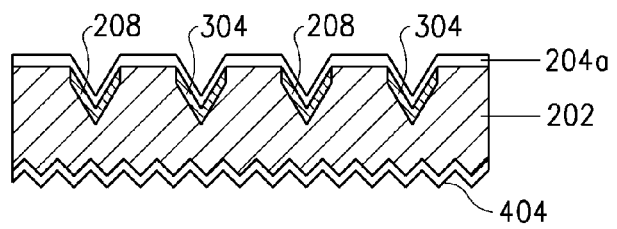
Figure 4D:
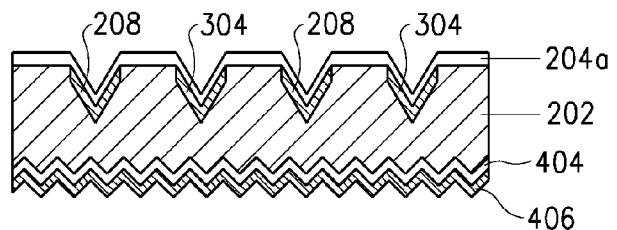
Figure 5A:
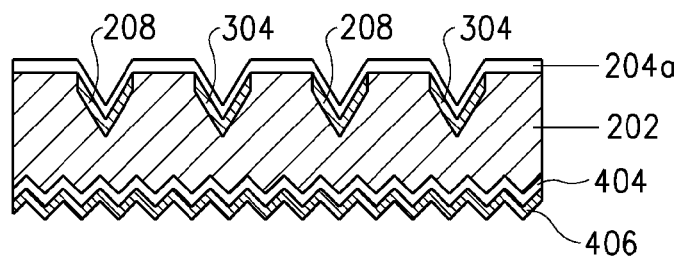
FIGS. 5A to 5C are drawings for explaining a production process when producing a solar cell.
Figure 5B:
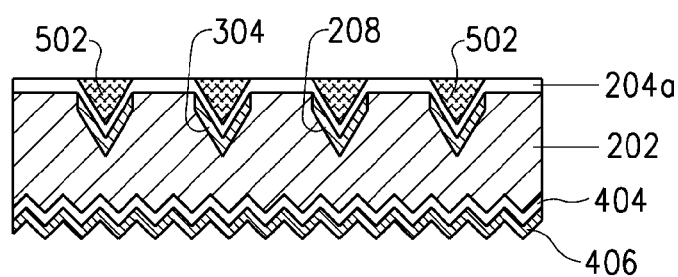
Figure 5C:
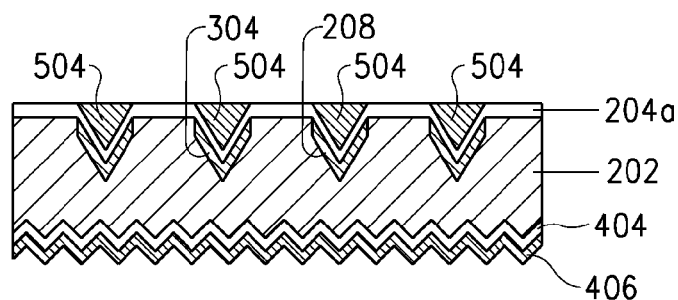

After removing the oxide film on the other surface (the surface on which the oxide film 204b is formed) of the silicon substrate 202 in which two types of V grooves have been formed in this manner (FIG. 4A), anisotropic etching is carried out with potassium hydroxide (KOH) or tetramethyl ammonium hydroxide (TMAH) and so on to form a textured structure 402 in the form of stripes having a triangular cross-section (FIG. 4B). By then carrying out dry oxidation in a diffusion furnace, an oxide film 404 is formed on the other side of the substrate (FIG. 4C).

Subsequently, titanium dioxide ($TiO_2$), for example, is then deposited on the side of the oxide film 404 at normal temperatures by sputtering and so on (titanium dioxide film: 406). As a result, a light receiving side having an anti-reflective film with a textured structure is formed on the other side of the substrate.

Next, electrodes are formed using the electrically conductive paste of the present invention (step (1) of the production process of the present invention). In this step, the electrically conductive paste 502 of the present invention is embedded in the V grooves (FIG. 5B) of the substrate obtained using the method described above (FIG. 5A). Embedding of the electrically conductive paste can be carried out by a patterning method such as screen printing, stencil printing or dispenser applying.

Next, the substrate filled with the electrically conductive paste (FIG. 5A) is fired at a predetermined temperature (for example, 450 to 900° C.) (FIG. 5C) (step (2) of the production process of the present invention). As a result, electrodes 504 are formed.

In the present invention, in the case of an oxide film being formed on the $n^+$-type silicon layer 208 and the $p^+$-type silicon layer 304, by firing the electrically conductive paste to fire through the oxide film during formation of the electrodes, the electrode material is coupled directly to the semiconductor and electrical contact is formed.

Back contact-type solar cell electrodes of the present invention are produced according to the process shown in FIG. 5.

A solar cell (not shown) is then fabricated by covering the side of the electrodes with a protective film, forming wiring by applying with an electrically conductive ink and dicing.

EXAMPLES

Although the following provides an explanation of the present invention through examples thereof, the present invention is not limited to these examples.
(I) Preparation of Silver Pastes Silver pastes 1 and 2 were produced to have the compositions shown in Table 1 using the materials indicated below.
  (i) Silver Particle
  Flaked silver particle [$d_{50}$ 2.7 µm (as determined with a laser scattering-type particle size distribution measuring apparatus)
  (ii) Glass Frit
  Leaded: Lead borosilicate glass frit
  Components: $SiO_2/PbO/B_2O_3/ZnO$
  Softening point: 440° C.
  Lead-free: Lead-free bismuth glass frit
  Components: $SiO_2/Al_2O_3/B_2O_3/ZnO/Bi_2O_3/SnO_2$
  Softening point: 390° C.

(iii) Resin
Ethyl cellulose resin (Aqualon, Hercules)
(iv) Solvent
Terpineol

TABLE 1

| (Parts by weight) | Silver particle | Glass frit Leaded | Glass frit Lead-free | Resin | Solvent | Total |
|---|---|---|---|---|---|---|
| Paste 1 | 70.30 | 5.25 | | 2.50 | 21.95 | 100.00 |
| Paste 2 | 70.30 | | 5.25 | 2.50 | 21.95 | 100.00 |

The silver particle, glass frit, resin and solvent were each weighed, mixed and kneaded with a three-roll kneader to obtain silver pastes.

(II) Preparation of Added Metal Pastes

Pastes A to I were prepared using the metal particles and metal-loaded particles of each of the metals (to be referred to as the added particles), resin and solvent shown in Table 2. The resin and solvent were the same as those used to prepare the silver paste described above.

TABLE 2

| (Parts by weight) | Type of added particles | Added particles | Resin | Solvent | Total |
|---|---|---|---|---|---|
| Paste A | Ni | 10.00 | 1.30 | 8.70 | 20 |
| Paste B | W | 10.00 | 1.30 | 8.70 | 20 |
| Paste C | Pd | 10.00 | 1.30 | 8.70 | 20 |
| Paste D | Ag/Pd alloy | 10.00 | 1.30 | 8.70 | 20 |
| Paste E | Pt | 10.00 | 1.30 | 8.70 | 20 |
| Paste F | Au | 10.00 | 1.30 | 8.70 | 20 |
| Paste G | Ru | 10.00 | 1.30 | 8.70 | 20 |
| Paste H | Rh | 10.00 | 1.30 | 8.70 | 20 |
| Paste I | Pt-loaded graphite | 5.00 | 1.95 | 13.05 | 20 |

The metal particles, resin and solvent were each weighed, mixed and stirred for 2 minutes using a rotary mixer to obtain added metal pastes.

(III) Preparation of Electrically Conductive Pastes

The silver paste prepared in (I) above and the pastes A to I prepared in (II) above were mixed and stirred for 2 minutes with a rotary mixer. Pastes A to I were added to the silver paste so that the mixing ratio was 1% by weight of the added particles to the weight of the silver in the silver paste (although two types of electrically conductive pastes were prepared for the Pt-loaded graphite having mixing ratios of 1% by weight and 2% by weight). For example, a silver paste containing Pd metal was prepared by adding 0.142 parts by weight of paste C to paste 1 (10.00 parts by weight).

(IV) Evaluation Method

The resistance values ($\Omega$) were measured for each of the resulting electrically conductive pastes.

Figure 6A:
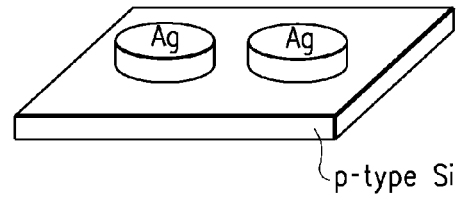
Figure 6B:
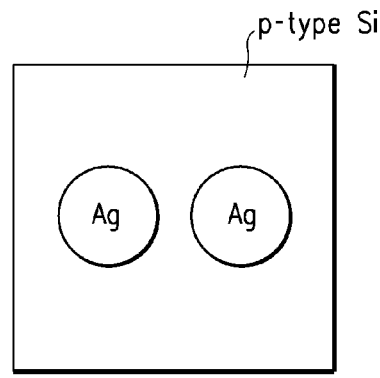

Samples were prepared as shown in FIGS. 6A and 6B, and contact resistance was measured for both electrodes (indicated with Ag in the drawings). Samples were prepared by cutting a commercially available 4-inch single crystal silicon wafer (Mitsubishi Materials Corp., crystal axis (1.0.0), P-type conductivity) into squares measuring 20 mm on a side with a laser scriber, and applying the electrically conductive paste onto the wafer in a circular pattern at two locations followed by firing to form electrodes.

Sample Shape:

Circular patterns having a diameter of 6 mm were formed at an interval of 1 mm on an Si wafer cut to the shape of a square measuring 20 mm on a side (see FIG. 6B).

Firing Conditions:

The wafers were fired under the following conditions using an IR heating belt furnace.

Maximum set temperature: 600° C.
Belt speed: 370 cpm
Furnace temperature profile:
400° C. or higher: 18 seconds
500° C. or higher: 12 seconds Resistance Value Measurement Conditions:

Current and voltage characteristics between the sample electrodes formed under the conditions described above were measured with the HSV-100 Cyclic Voltanometry apparatus available from Hokuto Denko Corp. The average of inter-electrode resistance over an applied voltage range of 0.2 to 0.4 V was used as the resistance value.

Figure 6C:
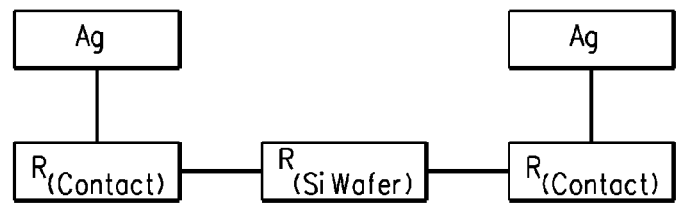
FIG. 6C is a drawing for explaining resistance values measured between electrodes.

As shown in FIG. 6C, since the resistance of the fabricated electrodes was small enough to be able to be ignored in terms of magnitude, the measured resistance values were taken to be the sum of the resistance value of the Si wafer and the contact resistance at the Si—Ag (electrode) interface. Since the resistance value of the Si wafer is constant, the magnitude of the measured resistance represents the magnitude of the contact resistance.

(V) Results

The results of measuring the resistance values of each of the electrically conductive pastes are shown in Table 3 (using paste 1 for the silver paste) and Table 4 (using paste 2 for the silver paste).

TABLE 3

Resistance Values and Evaluation of Electrically Conductive Pastes Using Paste 1 for the Silver Paste

| | Added Paste | | Resistance Value ($\Omega$) | Judgment* |
|---|---|---|---|---|
| Comparative Example 1 | Not added | | 87,000 | Ineffective |
| Comparative Example 2 | Paste A | Ni | 88,500 | Ineffective |
| Example 1 | Paste B | W | 6,300 | Effective |
| Example 2 | Paste C | Pd | 2,200 | Very effective |
| Example 3 | Paste D | Ag/Pd alloy | 3,900 | Very effective |
| Example 4 | Paste E | Pt | 400 | Very effective |
| Comparative Example 3 | Paste F | Au | 82,000 | Ineffective |
| Example 5 | Paste G | Ru | 1,200 | Very effective |
| Example 6 | Paste H | Rh | 8,400 | Effective |
| Example 7 | Paste I | Pt-loaded graphite | 49,00- | Ineffective |
| Example 8 | Paste I (2 wt %) | Pt-loaded graphite | 24,000 | Effective |

*Judgment: A resistance value 1/20 or less the resistance value in the case of not adding an added paste (i.e., the Comparative Example resistance value) was judged to be "very effective", while a value of 1/2 or less the resistance value was judged to be "effective".

TABLE 4

Resistance Values and Evaluation of Electrically Conductive Pastes Using Paste 2 for the Silver Paste

| | Added Paste | | Resistance Value ($\Omega$) | Judgment* |
|---|---|---|---|---|
| Comparative Example 4 | Not added | | 75,000 | Ineffective |
| Comparative Example 5 | Paste A | Ni | 85,000 | Ineffective |
| Example 9 | Paste B | W | 3,600 | Very effective |
| Example 10 | Paste C | Pd | 128 | Very effective |
| Example 11 | Paste D | Ag/Pd alloy | 4,200 | Effective |
| Example 12 | Paste E | Pt | 113 | Very effective |

TABLE 4-continued

Resistance Values and Evaluation of Electrically
Conductive Pastes Using Paste 2 for the Silver Paste

| | Added Paste | | Resistance Value (Ω) | Judgment* |
|---|---|---|---|---|
| Comparative Example 6 | Paste F | Au | 84,000 | Ineffective |
| Example 13 | Paste G | Ru | 1,100 | Very effective |
| Example 14 | Paste H | Rh | 7,300 | Effective |
| Example 15 | Paste I | Pt-loaded graphite | 9,700 | Effective |
| Example 16 | Paste I (2 wt %) | Pt-loaded graphite | 8,600 | Effective |

*Judgment: A resistance value 1/20 or less the resistance value in the case of not adding an added paste was judged to be very effective, while that 1/2 or less the resistance value was judged to be effective.

On the basis of the above results, with the exception of nickel and gold, the addition of tungsten, palladium, silver/palladium alloy, platinum, ruthenium and rhodium to a silver paste at 1% by weight was able to lower contact resistance. Palladium, platinum and ruthenium in particular greatly contributed to a decrease in contact resistance.

Even powders not consisting of a single component such as the silver/palladium alloy and the platinum-loaded graphite clearly contributed to a decrease in contact resistance. Furthermore, the reason for the degree of the contribution to decreased contact resistance being lower as compared with the case of using a single metal is thought to be because, since the powder itself was added at 1% by weight, the content of palladium or platinum in the silver paste decreased correspondingly.

A silicon oxide film referred to as a natural oxide film having a thickness of 10 to 15 Angstroms is known to normally be present on untreated silicon wafers. The pastes of the examples are believed to have fired through this silicon oxide film and make direct contact with the semiconductor surface.

What is claimed is:

1. A method for producing a solar cell electrode, comprising the steps of:
    (1) applying a paste comprising (a) electrically conductive particles containing silver particle having a particle size of 0.1 to 10 microns and added particle selected from the group consisting of (i) metal particles selected from the group consisting of Mo, Tc, Ru, Rh, Pd, W, Re, Os, Ir and Pt particles, onto the opposite side from the light receiving side of a back contact-type solar cell substrate, wherein content of the silver particle is 40 to 90 wt %, and content of the added particle is 0.01 to 10 wt % based on the weight of the paste; and
    (2) firing the applied paste.

2. The method for producing a solar cell electrode according to claim 1, wherein the metal particles are selected from the group consisting of Ru, Rh, Pd, W, and Pt particles.

3. The method for producing a solar cell electrode according to claim 2, wherein the metal particles are Ru, Pd or Pt particles.

4. The method for producing a solar cell electrode according to claim 1, the content of a third conductive particle, which is not included the concept of the silver particles nor the added particle, is less than 2 wt % based on the weight of the paste.

5. The method according to claim 1, wherein the paste is fired at 450 to 900 C.

6. The method for producing a solar cell electrode according to claim 1, wherein content of the added particle is 0.1 to 5 wt % based on the weight of the paste.

* * * * *